(12) United States Patent
Hegrenes et al.

(10) Patent No.: US 9,433,095 B2
(45) Date of Patent: Aug. 30, 2016

(54) IMPLEMENTING SIMULTANEOUSLY CONNECTING OF MULTIPLE DEVICES IN A MULTI-TIERED, MULTI-DIRECTIONAL, ENHANCED TOLERANCE SYSTEM WITH MECHANICAL SUPPORT STRUCTURES

(71) Applicant: International Business Machines Corporation, Armonk, NY (US)

(72) Inventors: Aaron M. Hegrenes, Rochester, MN (US); Nathan D. Karl, Denver, CO (US); Robert J. Monahan, Rochester, MN (US); Stephen P. Mroz, Rochester, MN (US); Christopher L. Tuma, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 14/482,498

(22) Filed: Sep. 10, 2014

(65) Prior Publication Data

US 2016/0073501 A1    Mar. 10, 2016

(51) Int. Cl.
| | |
|---|---|
| H05K 5/00 | (2006.01) |
| H05K 1/14 | (2006.01) |
| H05K 3/36 | (2006.01) |
| H05K 13/00 | (2006.01) |
| G06F 1/18 | (2006.01) |
| H05K 7/14 | (2006.01) |

(52) U.S. Cl.
CPC ............ *H05K 1/144* (2013.01); *G06F 1/18* (2013.01); *H05K 3/36* (2013.01); *H05K 7/142* (2013.01); *H05K 7/1487* (2013.01); *H05K 13/0023* (2013.01); *H05K 2201/042* (2013.01); *H05K 2201/10378* (2013.01); *H05K 2201/2018* (2013.01)

(58) Field of Classification Search
CPC .... G06F 1/18; H05K 13/0023; H05K 1/144; H05K 2201/042; H05K 2201/10378; H05K 2201/2018; H05K 3/36; H05K 7/142; H05K 7/1487
See application file for complete search history.

(56) References Cited

U.S. PATENT DOCUMENTS

| | | |
|---|---|---|
| 3,832,603 A | 8/1974 | Cray et al. |
| 4,268,100 A | 5/1981 | Kekas et al. |

(Continued)

OTHER PUBLICATIONS

"High Density, High Speed Interconnect Method for Multiple Board Assemblies" IBM, IP.com Prior Art Database Technical Disclosure, IP.com No. IPCOM000176701D, Nov. 20, 2008.

(Continued)

*Primary Examiner* — Yuriy Semenenko
(74) *Attorney, Agent, or Firm* — Joan Pennington

(57) ABSTRACT

A method and apparatus are provided for implementing simultaneously connecting of multiple devices in a multi-tiered, multi-directional, enhanced tolerance system with mechanical support structures. A main system planar assembly and an elevated planar assembly share a direct connection provided by a plurality of connectors with no cables. A mechanical support bracket is attached to a top surface of the main system planar assembly positioning and supporting the elevated planar assembly spaced appropriately for accurately connecting respective connectors with respective chassis connectors. The elevated planar assembly includes a stiffening component to facilitate proper spacing between upper and lower levels of respective connectors and tool-less insertion and extraction of the elevated planar assembly.

11 Claims, 8 Drawing Sheets

(56) References Cited

U.S. PATENT DOCUMENTS

| | | |
|---|---|---|
| 5,768,106 A | 6/1998 | Ichimura |
| 6,317,330 B1 | 11/2001 | Portman et al. |
| 6,974,333 B2 | 12/2005 | Wildes et al. |
| 7,021,942 B2 | 4/2006 | Grant et al. |
| 7,746,654 B2 | 6/2010 | Franz et al. |
| 8,089,770 B2 | 1/2012 | Olesiewicz et al. |
| 8,366,464 B1 | 2/2013 | Figuerado et al. |
| 2010/0281199 A1* | 11/2010 | Fu .................... G06F 13/409 710/300 |
| 2013/0237092 A1* | 9/2013 | Rubens .............. H01R 13/6581 439/607.23 |
| 2015/0382499 A1* | 12/2015 | Chiasson ............. G11B 33/124 361/679.33 |
| 2016/0073544 A1* | 3/2016 | Heyd .................... G11B 33/00 361/679.31 |

OTHER PUBLICATIONS

Appendix P—List of IBM Patents or Patent Applications Treated As Related—Sep. 19, 2015.

\* cited by examiner

IMPLEMENTING SIMULTANEOUSLY CONNECTING OF MULTIPLE DEVICES IN A MULTI-TIERED, MULTI-DIRECTIONAL, ENHANCED TOLERANCE SYSTEM WITH MECHANICAL SUPPORT STRUCTURES

FIELD OF THE INVENTION

The present invention relates generally to the data processing field, and more particularly, relates to method and apparatus for implementing simultaneously connecting of multiple devices in a multi-tiered, multi-directional, enhanced tolerance system with mechanical support structures.

DESCRIPTION OF THE RELATED ART

There are cases where a system, such as a single server product is designed to plug and fill the space of two adjacent slots on its respective host chassis mid-plane. In this scenario, the need can arise for multiple circuit boards to be arranged in a stacked fashion to support the connectors that dock to the chassis mid-plane. Additionally, the stacked circuit boards must share a connection with each other.

To accomplish the task of reliable docking and undocking, the method of stacking multiple levels of circuit boards within the server product must satisfy rigidity requirements and obey the critical mechanical tolerance values set forth by connector arrangements on the chassis mid-plane.

One way to successfully stack circuit boards is to isolate the mechanical structures that support each individual board. In doing so, a flexible cable could be designed to bridge the connection from one circuit board to the next. The utilization of a cable, however, adds significant expense to the system as well as increasing the need for extra parts to be procured and stocked.

These extra parts also add steps when assembling and disassembling the circuit boards to and from one another within the server node. As such, appreciable cost and complication are increased when implementing this type of solution including one or more cables.

Another potential solution would be to assemble the stacked circuit boards such that they are allowed to float with respect to one another. While this might allow the chassis mid-plane connector pairs to dock appropriately, the stacked circuit board connection is not compliant enough to expand and collapse in order to allow the circuit boards to float. As identified during product development studies, pin wipe and tolerance requirements when dealing with a direct board-to-board stacked connection can force a floating mechanical solution out of the realm of feasibility.

A need exists for an efficient and effective method and apparatus for simultaneously connecting of multiple devices in a multi-tiered, multi-directional, enhanced tolerance system with mechanical support structures.

SUMMARY OF THE INVENTION

Principal aspects of the present invention are to provide a method and apparatus for implementing simultaneously connecting of multiple devices in a multi-tiered, multi-directional, enhanced tolerance system with mechanical support structures. Other important aspects of the present invention are to provide such method and apparatus substantially without negative effects and that overcome many of the disadvantages of prior art arrangements.

In brief, a method and apparatus are provided for implementing simultaneously connecting of multiple devices in a multi-tiered, multi-directional, enhanced tolerance system. A main system planar assembly and an elevated planar assembly share a direct connection provided by a plurality of respective connectors. A mechanical support bracket is attached to a top surface of the main system planar assembly positioning and supporting the elevated planar assembly spaced appropriately for accurately connecting respective connectors with respective chassis connectors. The elevated planar assembly includes a stiffening component to facilitate proper spacing between upper and lower levels of respective connectors and tool-less insertion and extraction of the elevated planar assembly.

In accordance with features of the invention, the plurality of respective connectors for accurate connecting with respective chassis connectors are provided for connecting with respective chassis connectors without requiring cables.

In accordance with features of the invention, the mechanical support bracket includes predefined positioning features cooperating with predefined features of the main system planar assembly positioning and retaining the elevated planar assembly.

In accordance with features of the invention, the mechanical support bracket and stiffening component are provided in direct contact engagement.

In accordance with features of the invention, the mechanical support bracket and stiffening component respectively are formed by injection molding technique and each formed of a selected electrically non-conducting material having sufficient strength and rigidity providing predefined mechanical support for positioning and retaining the elevated planar assembly.

In accordance with features of the invention, an interposer assembly is assembled with the mechanical support bracket.

In accordance with features of the invention, a pair of latching arms are attached to the stiffening component of the elevated planar assembly and allow for easy, tool-less installation and extraction of the elevated planar assembly to and from the system.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and apparatus are provided for implementing simultaneously connecting of multiple devices in a multi-tiered, multi-directional, enhanced tolerance system.

Figure 1:
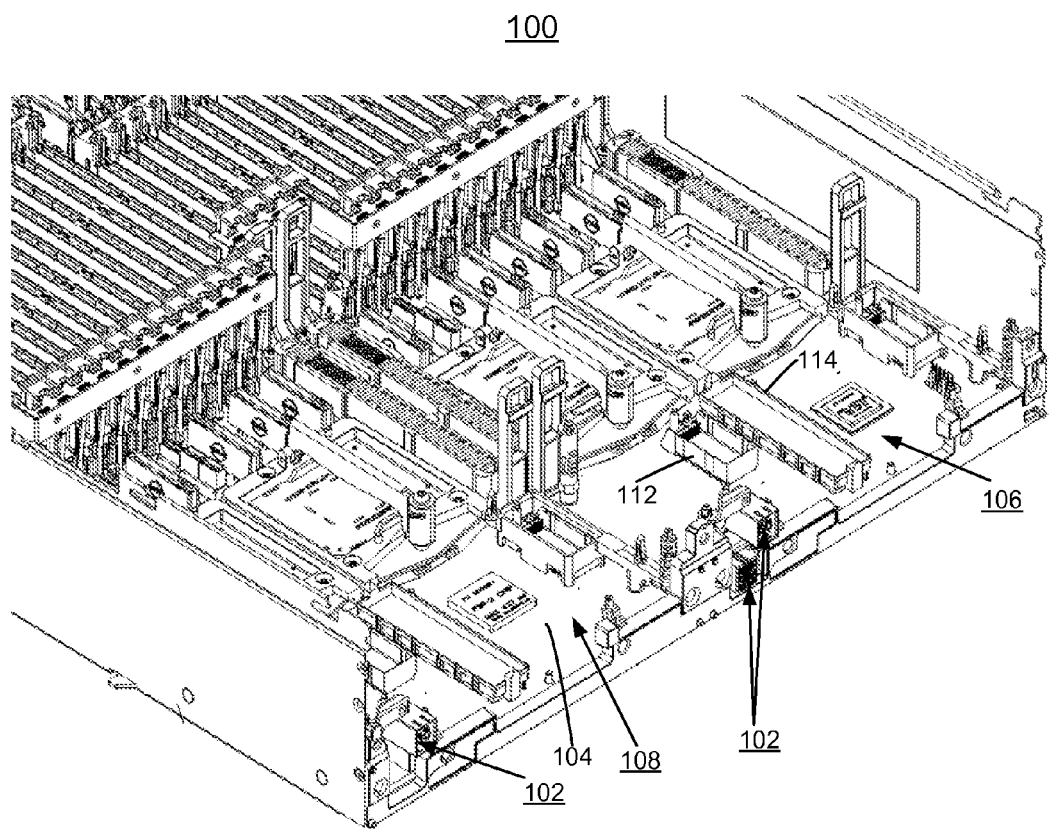
FIG. 1 is a perspective view not to scale of a main system planar assembly in accordance with a preferred embodiment.

Having reference now to the drawings, in FIG. 1, there is shown a main system planar assembly generally designated by the reference character 100 in accordance with a preferred embodiment. The main system planar assembly 100 includes a plurality of respective connectors, each connector generally designated by the reference character 102. The illustrated connectors 102 are mounted on a top surface 104 of a main system planar circuit board assembly generally designated by the reference character 106. The main system planar circuit board assembly 106 is loaded into a sheet metal chassis pan 108. The main system planar circuit board assembly 106 includes predefined positioning features 112, 114 cooperating with predefined features of a mechanical support bracket 200 illustrated with respect to FIG. 2.

Figure 2:
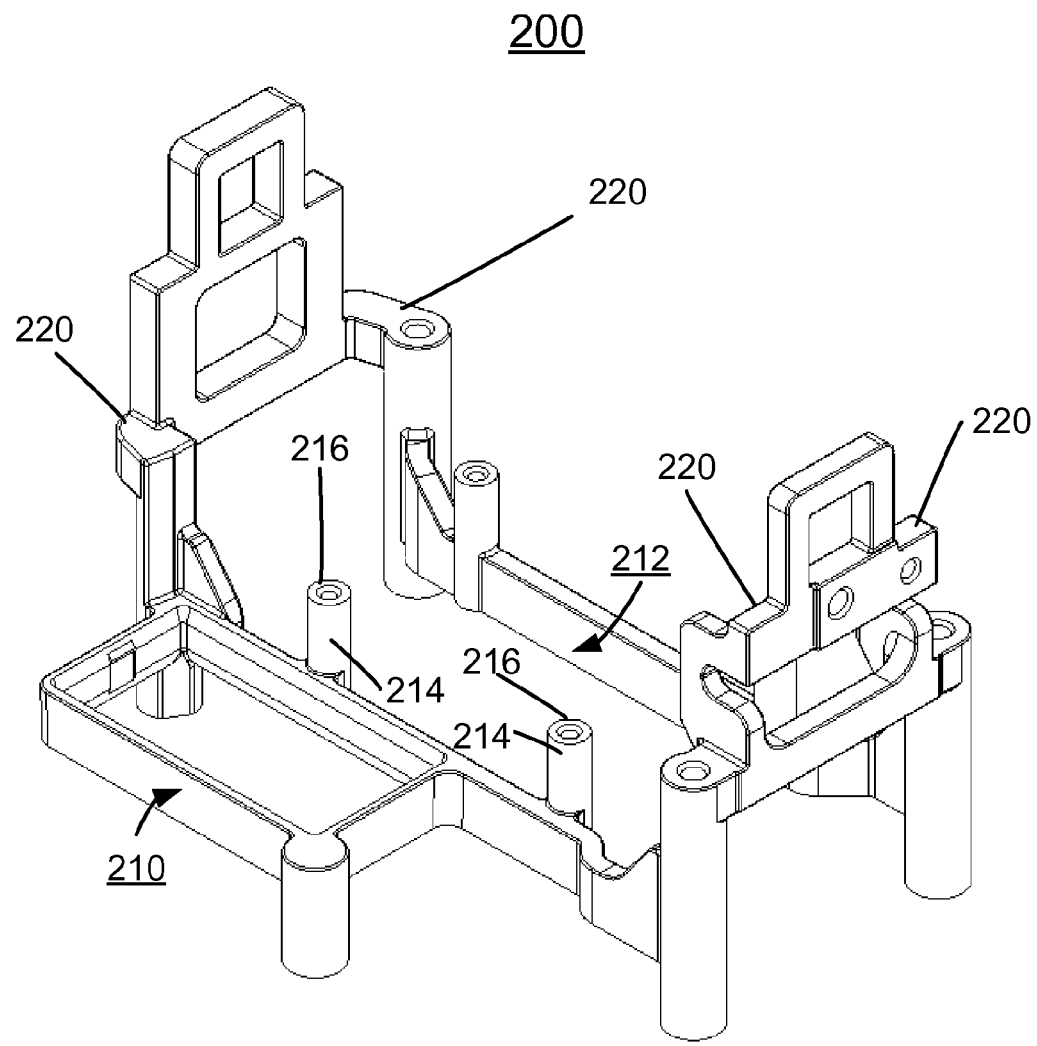
FIG. 2 is a perspective view not to scale of a mechanical support bracket in accordance with a preferred embodiment.

Referring to FIG. 2, a mechanical support bracket generally designated by the reference character 200 is shown in accordance with a preferred embodiment.

Figure 3:
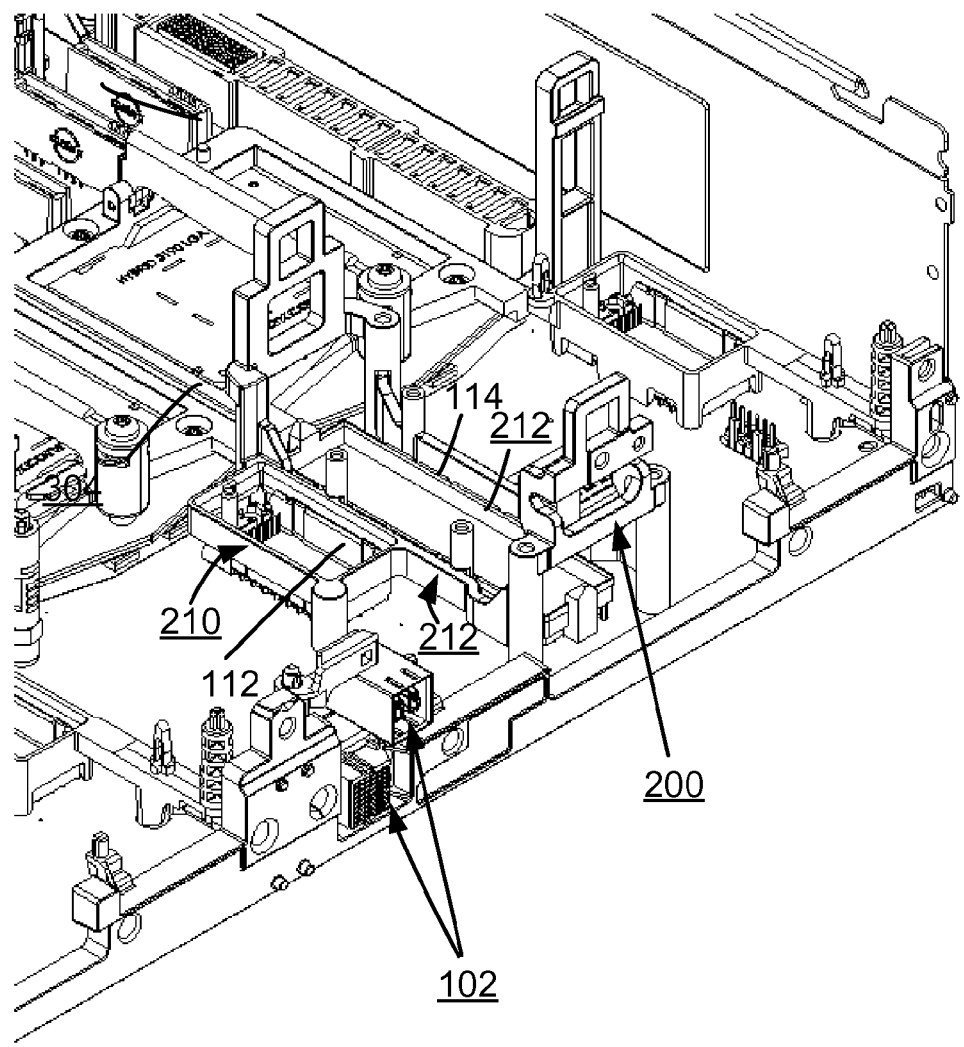
FIG. 3 is a perspective view not to scale of the mechanical support bracket of FIG. 2 attached to a top surface of the main system planar of FIG. 1 in accordance with a preferred embodiment.

Referring also to FIG. 3, there is shown an assembly generally designated by the reference character 300 of the mechanical support bracket 200 attached to a top surface 104 of the main system planar assembly 100 in accordance with a preferred embodiment.

Figure 6:
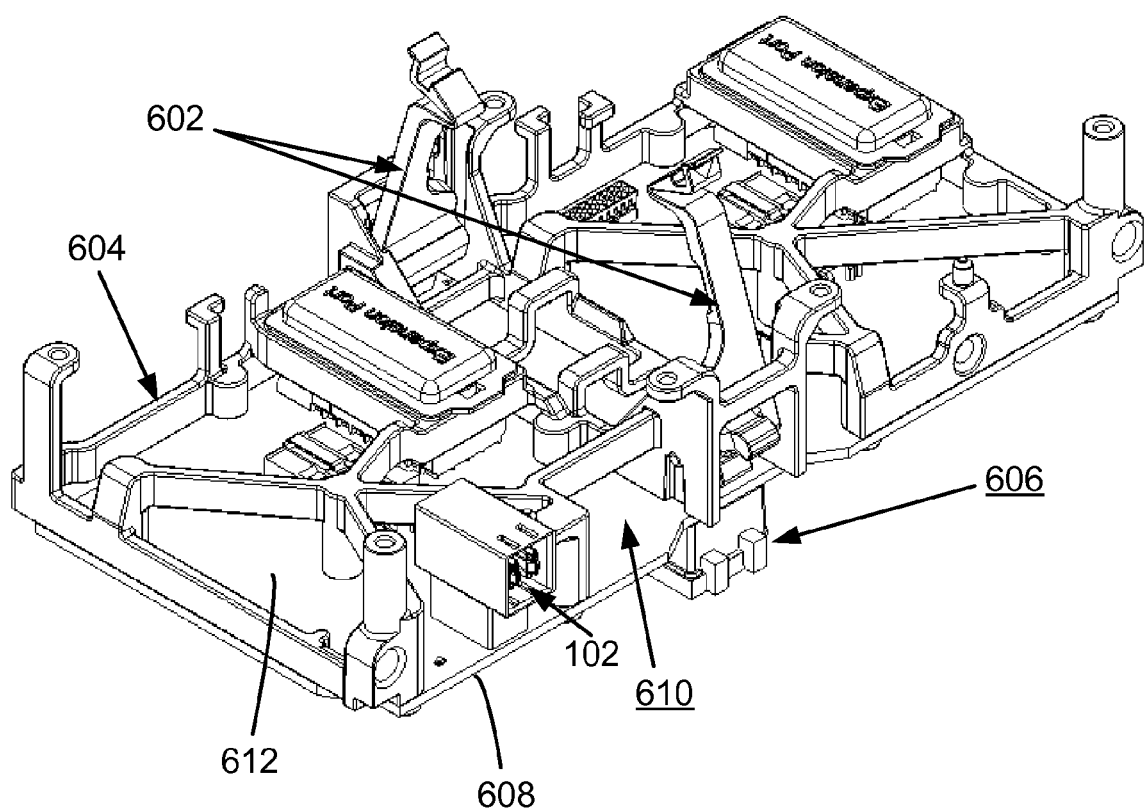
FIG. 6 is a perspective view not to scale of an elevated planar circuit board assembly in accordance with the preferred embodiment.
Figure 7:
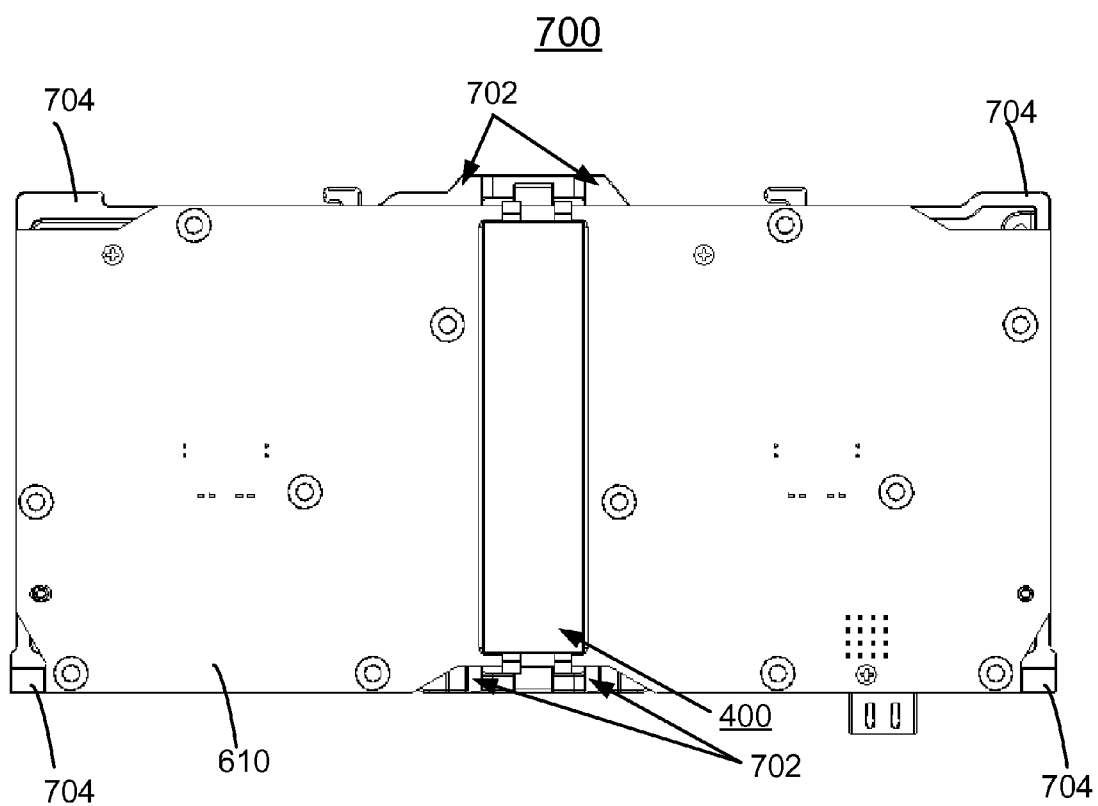
FIG. 7 is a bottom plan view not to scale of the elevated planar circuit board assembly of FIG. 6 in accordance with the preferred embodiment.

The mechanical support bracket 200 is an integral unit or unitary memory 200, for example, formed by injection molding technique and formed of a selected electrically non-conducting material having sufficient strength and rigidity providing predefined mechanical support for positioning and retaining an elevated planar assembly 600 illustrated and described with respect to FIGS. 6 and 7.

The mechanical support bracket 200 includes predefined positioning features 210, 212 defining respective cooperating cavities with the predefined features 112, 114 of main system planar circuit board assembly 106 for positioning and retaining the elevated planar assembly of FIGS. 6 and 7. The predefined positioning features 210, 212 are shown surrounding the predefined features 112, 114 of main system planar circuit board assembly 106 in FIG. 3.

Figure 4:
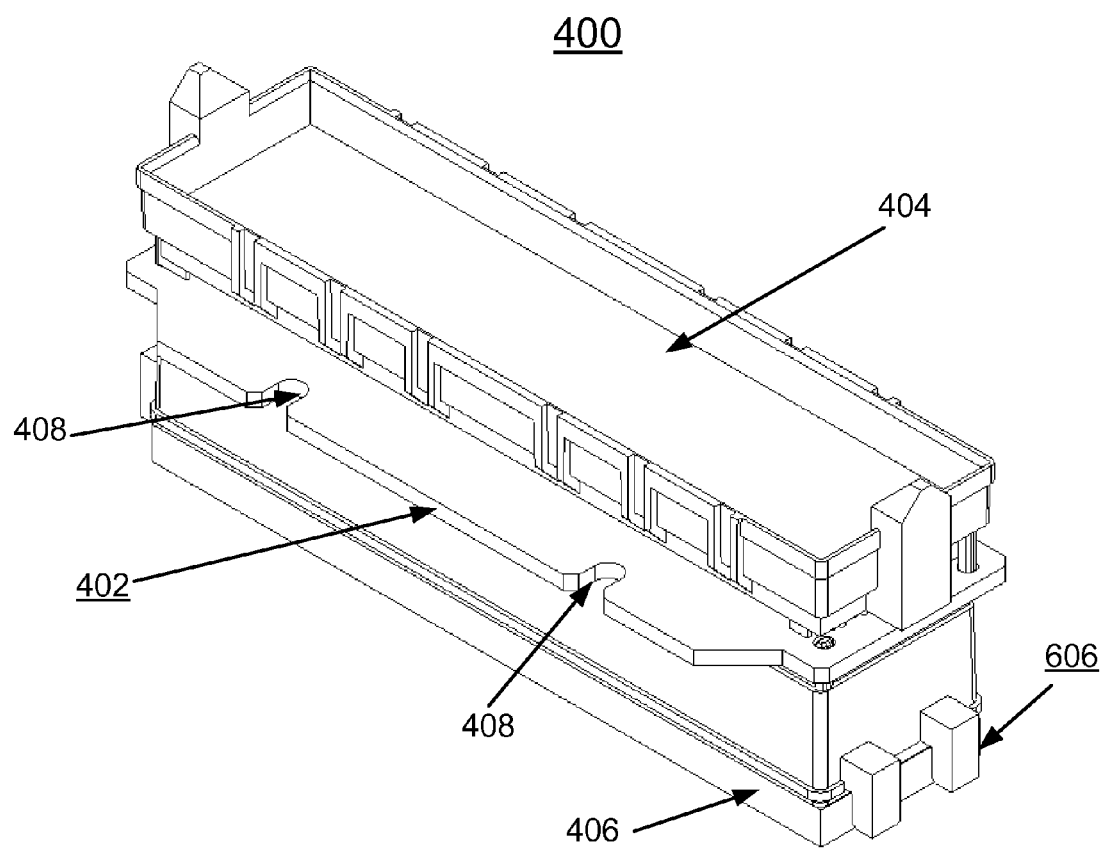
FIG. 4 is a perspective view not to scale of an interposer assembly in accordance with the preferred embodiment.
Figure 5:
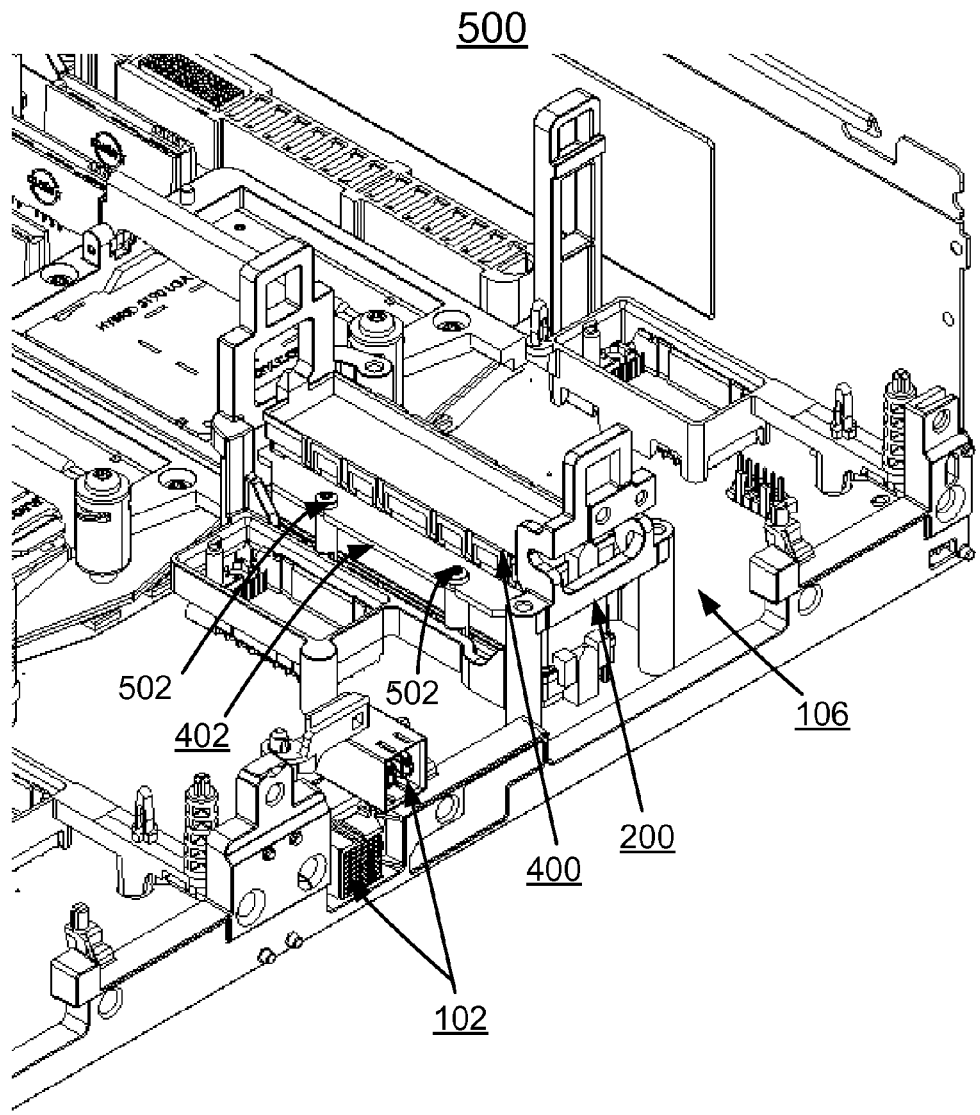
FIG. 5 is a perspective view not to scale of the interposer assembly of FIG. 4 assembled with the mechanical support bracket of FIGS. 2 and 3 in accordance with the preferred embodiment.

The mechanical support bracket 200 includes a pair of support columns 214 mounted with the main system planar assembly 106, and an upper end 216 for mounting with an interposer card illustrated and described with respect to FIGS. 4 and 5. The mechanical support bracket 200 includes a plurality of contact support ledges or support points 220 for mounting with the elevated planar assembly of FIGS. 6 and 7.

Referring to FIG. 4, there is shown an interposer assembly generally designated by the reference character 400 in accordance with the preferred embodiment. The interposer assembly 400 is secured to the mechanical support bracket 200 as shown in an assembly 500 of FIG. 5. The interposer assembly 400 includes an interposer card designated by the reference character 402, an upper member 404 and a lower member 406. The interposer card 402 includes notches 408 respectively receiving and retaining fasteners provided within the upper ends 216 of support columns 214 of the mechanical support bracket 200 shown in FIG. 2. For example, the interposer card 402 is used to support a predefined stacked connector group. The interposer assembly 400 includes a connector 606 as illustrated in an elevated planar circuit board assembly 600.

Referring to FIG. 5, there is shown an assembly generally designated by the reference character 500 of the interposer assembly 400 assembled with the mechanical support bracket 200 in accordance with the preferred embodiment. A pair of fasteners 502 is provided within notches 408 securing the interposer card 402 with the mechanical support bracket 200. The mechanical support bracket 200 sets the appropriate height for mating a lower connector pair in the stack between the top surface 104 of the main system planar circuit board assembly 106 to a bottom surface of the interposer card 402.

Referring to FIG. 6, there is shown an elevated planar circuit board assembly generally designated by the reference character 600 in accordance with the preferred embodiment. The illustrated elevated planar circuit board assembly 600 includes a pair of latching arms 602 that are shown in a partially open position. The latching arms 602 are attached to a stiffener 604 and allow for easy, tool-less installation and extraction of the elevated planar assembly 600 to and from the final system assembly 800 illustrated and described with respect to FIG. 8. A final stacked connector 606 resides on a bottom side 608 of an elevated planar circuit board 610, while an upper chassis mid-plane connector 102 and the stiffener 604 reside on a top surface 612 of the board 610.

Referring to FIG. 7, there is shown a bottom plan view not to scale of the elevated planar circuit board assembly 600 with the interposer assembly 400 in accordance with the preferred embodiment. As visible in FIG. 7, portions of the circuit board 610 have been removed to expose corners 704 of the elevated planar assembly 600. The four locations 702 indicated by arrows 702 come into direct contact with the support bracket 200 shown in FIG. 2 when the elevated planar assembly 600 is fully incorporated into the final system assembly 800. The stiffener 604 optionally is stabilized by additional structures (not shown) within the system 800 or server product. Such added support can be provided if needed to prevent excessive rocking of the elevated planar assembly 600, for example, when daughter cards are plugged and unplugged within the upper tier of the system assembly 800.

Figure 8:
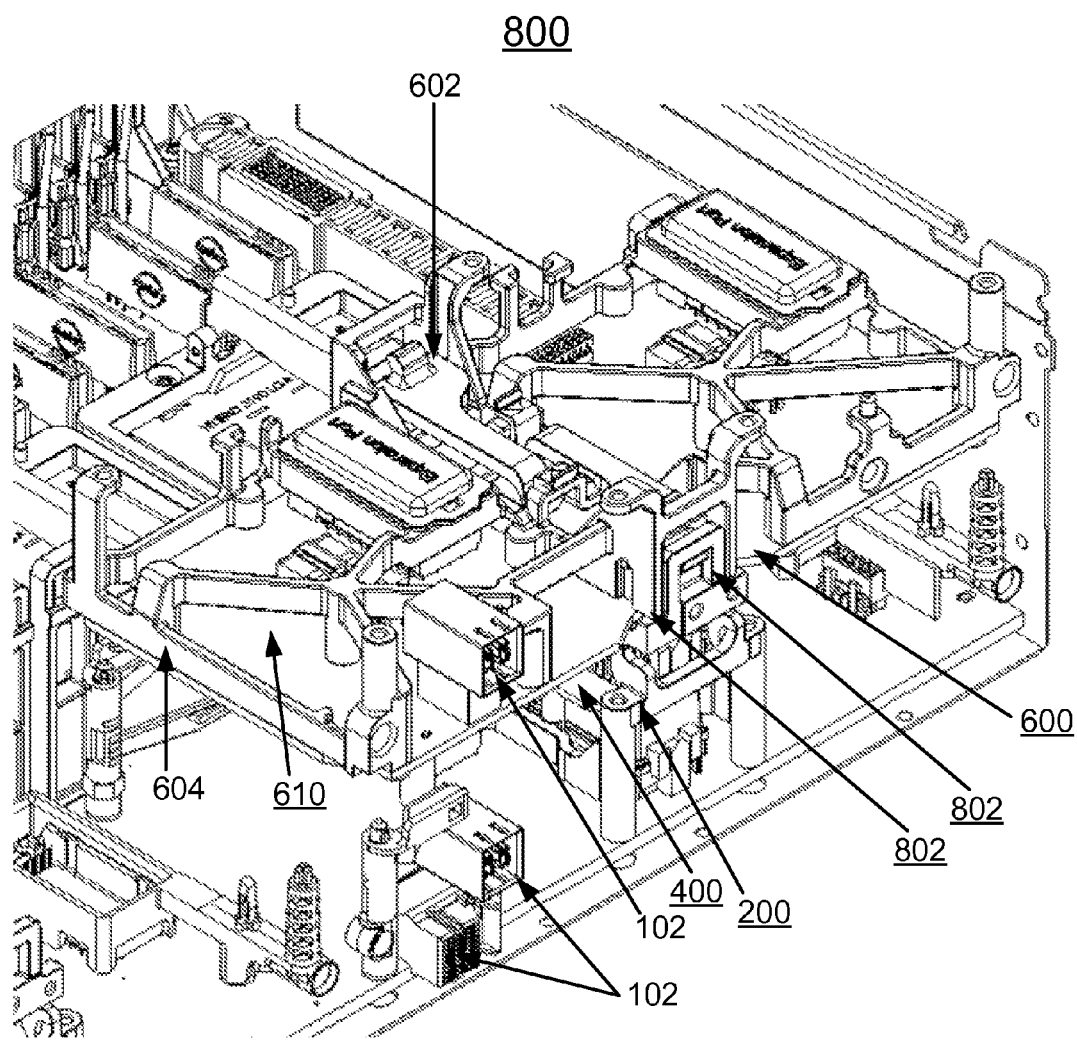
FIG. 8 is a perspective view not to scale of the elevated planar circuit board assembly of FIGS. 6 and 7 assembled into a final system assembly together with the mechanical support bracket of FIGS. 2 and 3 including the interposer assembly of FIGS. 4 and 5, the elevated planar circuit board assembly including the stiffener component of FIGS. 6 and 7 and the main system planar assembly of FIG. 1 in accordance with the preferred embodiment.

Referring to FIG. 8, there is shown a final system assembly generally designated by the reference character 800 in accordance with the preferred embodiment. The final system assembly 800 includes the elevated planar circuit board assembly 600 assembled into the system 800 with the main system planar assembly 100 assembled with the mechanical support bracket 200 including the interposer assembly 400, with the elevated planar circuit board assembly 600 including the stiffener component 604. Two of four locations 802 are indicated by arrows show where the topside stiffener 604 of the elevated planar assembly 600 comes into direct contact with the shoulders or ledges 220 of the mechanical support bracket 200, with the additional contact points at the opposite side of the elevated planar circuit board assembly 600.

The latching arms 602 are pre-loaded upwardly against the mechanical support bracket 200, which provides for rigid and secure engagement. Dimensionally, one key aspect is that the respective top surfaces 104, 612 of both the main system planar circuit board assembly 106 and elevated planar circuit board 610 are spaced appropriately for accurate connector docking to the chassis mid-plane. The reason for this accurate connector docking is that the seated contact made between the mechanical support bracket 200 and topside stiffener 604, both of which are affixed to the top surface 104, 612 of their respective circuit boards. Consequently, several tolerances including board thickness, board flatness, connector stack height, and attach co-planar tolerances, are eliminated from the vertical spacing of the upper and lower sets of chassis mid-plane connectors. Instead, these tolerance values for both the elevated planar board 610 and interposer board 402 are transferred to the pin wipe allowance of the upper stacked connector pair including interposer upper member 404 and connector 606. This pair must not be over or under-docked, which is achievable in the illustrated arrangement of the final assembly system 800.

In brief summary, the mechanical support bracket 200 and topside stiffener component 604, and their associated interaction, are arranged such that the upper and lower connector pairs are not fully docked. This effectively eliminates the tolerances of interposer 400, and elevated planar assembly 600 from the stack-up and therefore minimizes the overall tolerances in the system 800 such that both main planar assembly 100 and elevated planar assembly 600 can plug into the chassis mid-plane connectors without issue. Also, the mechanical support bracket 200 and topside stiffener 604 are sufficiently rigid so that the underdocked upper and lower connector pairs are immobilized to prevent connector pin and contact micro-motion that could come from external vibration forces.

While the present invention has been described with reference to the details of the embodiments of the invention shown in the drawing, these details are not intended to limit the scope of the invention as claimed in the appended claims.

What is claimed is:

1. An apparatus for implementing simultaneous connecting of multiple devices in a multi-tiered, multi-directional, enhanced tolerance system comprising:
   a main system planar assembly;
   an elevated planar assembly;
   a plurality of respective connectors for providing a direct connection to said main system planar assembly and said elevated planar assembly;
   a mechanical support bracket being attached to a top surface of said main system planar assembly positioning and supporting said elevated planar assembly located for accurately connecting of respective connectors with corresponding respective chassis connectors; and
   said elevated planar assembly including a stiffening component to facilitate set spacing between upper and lower levels of said plurality of respective connectors, and tool-less insertion and extraction of said elevated planar assembly.

2. The apparatus as recited in claim 1 wherein said plurality of respective connectors are provided for connecting with respective chassis connectors without requiring cables.

3. The apparatus as recited in claim 1 wherein said mechanical support bracket includes predefined positioning features cooperating with predefined features of said main system planar assembly for positioning and retaining said elevated planar assembly.

4. The apparatus as recited in claim 1 wherein said mechanical support bracket and said stiffening component are provided in direct contact engagement.

5. The apparatus as recited in claim 1 wherein said mechanical support bracket and said stiffening component respectively are formed by injection molding technique.

6. The apparatus as recited in claim 1 includes an interposer assembly assembled with said mechanical support bracket.

7. The apparatus as recited in claim 6 wherein said interposer assembly supports a stacked connector group of the plurality of respective connectors and said mechanical support bracket sets a predetermined height between a main planer top surface and an interposer board bottom surface for mating respective connectors.

8. The apparatus as recited in claim 1 includes a pair of latching arms attached to said stiffening component enabling tool-less installation and extraction of said elevated planar assembly to and from the system.

9. The apparatus as recited in claim 1 wherein each of said mechanical support bracket and said stiffening component is formed of a selected electrically non-conducting material having sufficient strength and rigidity to secure said elevated planar assembly at a set position.

10. The apparatus as recited in claim 1 wherein a subgroup of said plurality of respective connectors resides on a top surface of a main planar circuit board.

11. The apparatus as recited in claim 10 includes another subgroup of said plurality of respective connectors supported by an interposer card assembled with said mechanical support bracket.

* * * * *